(12) United States Patent  (10) Patent No.: US 9,209,022 B2
Colinge et al.  (45) Date of Patent: Dec. 8, 2015

(54) SEMICONDUCTOR STRUCTURE INCLUDING LATERALLY DISPOSED LAYERS HAVING DIFFERENT CRYSTAL ORIENTATIONS AND METHOD OF FABRICATING THE SAME

(71) Applicant: Taiwan Semiconductor Manufacturing Company Limited, Hsinchu (TW)

(72) Inventors: Jean-Pierre Colinge, Hsinchu (TW); Carlos H. Diaz, Mountain View, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/477,980

(22) Filed: Sep. 5, 2014

(65) Prior Publication Data

US 2015/0102469 A1   Apr. 16, 2015

Related U.S. Application Data

(63) Continuation-in-part of application No. 14/278,321, filed on May 15, 2014, now Pat. No. 9,034,717, which is a continuation-in-part of application No. 14/055,229, filed on Oct. 16, 2013, now Pat. No. 9,111,996.

(51) Int. Cl.
| | |
|---|---|
| *H01L 21/331* | (2006.01) |
| *H01L 21/76* | (2006.01) |
| *H01L 21/20* | (2006.01) |
| *H01L 29/04* | (2006.01) |
| *H01L 21/02* | (2006.01) |
| *B82Y 10/00* | (2011.01) |
| *B82Y 40/00* | (2011.01) |
| *H01L 29/66* | (2006.01) |
| *H01L 29/06* | (2006.01) |
| *H01L 29/41* | (2006.01) |

(52) U.S. Cl.
CPC ........... *H01L 21/02609* (2013.01); *B82Y 10/00* (2013.01); *B82Y 40/00* (2013.01); *H01L 21/02433* (2013.01); *H01L 21/02639* (2013.01); *H01L 21/02667* (2013.01); *H01L 29/0676* (2013.01); *H01L 29/413* (2013.01); *H01L 29/66439* (2013.01)

(58) Field of Classification Search
CPC ................... H01L 21/02609; H01L 21/02592; H01L 21/045; H01L 21/26506; H01L 21/2022; H01L 21/2652; H01L 21/84; H01L 27/1203
USPC ........... 257/223, 229, 628; 438/150, 198, 222
See application file for complete search history.

(56) References Cited

U.S. PATENT DOCUMENTS

| 8,183,627 B2 * | 5/2012 | Currie ........................... 257/329 |
| 8,836,627 B2 * | 9/2014 | Huang et al. .................... 345/96 |
| 2007/0063306 A1 * | 3/2007 | Doyle et al. .................. 257/486 |
| 2009/0108412 A1 * | 4/2009 | Itokawa et al. ............... 257/629 |

* cited by examiner

*Primary Examiner* — Hsien Ming Lee
(74) *Attorney, Agent, or Firm* — Jones Day (57) ABSTRACT

A semiconductor structure includes a substrate and first and second crystalline semiconductor layers. The first crystalline semiconductor layer has a first crystal orientation, and includes a crystallized amorphous region formed on the substrate. The second crystalline semiconductor layer is formed on the substrate, is laterally disposed of the first crystalline semiconductor layer, and has a second crystal orientation different from the first crystal orientation. A method of fabricating the semiconductor structure is also disclosed.

18 Claims, 8 Drawing Sheets

SEMICONDUCTOR STRUCTURE INCLUDING LATERALLY DISPOSED LAYERS HAVING DIFFERENT CRYSTAL ORIENTATIONS AND METHOD OF FABRICATING THE SAME

CROSS-REFERENCE TO RELATED APPLICATIONS

This application is a continuation-in-part of U.S. patent application Ser. No. 14/278,321, filed May 15, 2014, which is a continuation-in-part of U.S. patent application Ser. No. 14/055,229, filed Oct. 16, 2013, all of which are incorporated herein by reference in their entirety.

BACKGROUND

A conventional semiconductor structure includes a substrate, and a layer that is formed on the substrate, that has a (100), (110), or (111) crystal orientation, and that includes doped regions, in which field-effect transistors (FETs) may be formed. It is well known that an FET uses either electrons, e.g., an N-channel FET, or holes, e.g., a P-channel FET, for conduction. It is also well known that electrons have a high mobility along a certain direction, and that holes have a high mobility along another direction that is different from the direction, along which the electrons have the high mobility. The conventional semiconductor structure is disadvantageous in that, since the doped regions thereof have the same crystal orientation, an optimum mobility performance can only be obtained for either N-channel FETs or P-channel FETs that may be formed therein. It is therefore desirable to provide a semiconductor structure configured to optimize a mobility performance of both N-channel FETs and P-channel FETs that may be formed therein.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the structure in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor structure, and a method of fabricating the semiconductor structure. The semiconductor structure includes a substrate and first, second, and third crystalline semiconductor layers. The first and third crystalline semiconductor layers are formed on the substrate and have a first crystal orientation. The second crystalline semiconductor layer is formed on the substrate between the first and third crystalline semiconductor layers, is laterally disposed of the first and third crystalline semiconductor layers, and has a second crystal orientation different from the first crystal orientation.

Figure 1:
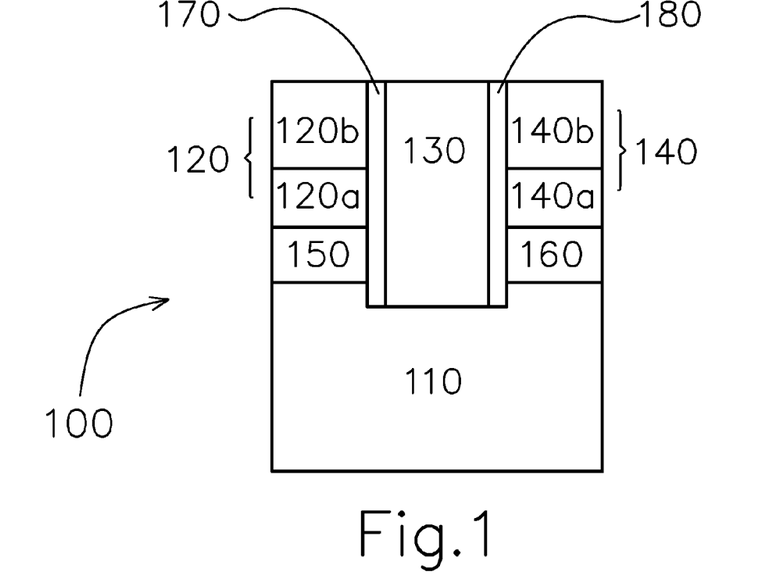
FIG. 1 depicts an example semiconductor structure in accordance with some embodiments.

FIG. 1 depicts an example semiconductor structure 100 in accordance with some embodiments. In the example of FIG. 1, the semiconductor structure 100 includes a substrate 110, a first crystalline semiconductor layer 120, a second crystalline semiconductor layer 130, and a third crystalline semiconductor layer 140.

The substrate 110 has left and right end regions, and an intermediate region between the left and right end regions thereof. The substrate 110 has a (100) crystal orientation. The substrate 110 is, for example, a bulk silicon substrate, a bulk germanium substrate, or a III-V semiconductor substrate.

The semiconductor structure 100 further includes a pair of epitaxial regions 150, 160 grown on the left and right end regions of the substrate 110, respectively. Each of the epitaxial regions 150, 160 is a region of an amorphous layer, where the amorphous layer is formed substantially over the substrate 110 and is crystallized via a solid-phase epitaxial growth process. The solid-phase epitaxial process uses a crystalline semiconductor structure of the substrate 110 as a crystal template in crystallizing the amorphous layer, and thus causes the epitaxial regions 150, 160 to take on the crystal orientation, e.g., (100), of the substrate 110. The epitaxial regions 150, 160 are, for example, a crystallized silicon, a crystallized germanium, a crystallized III-V semiconductor material, or a combination thereof.

The first crystalline semiconductor layer 120 includes a crystallized amorphous region 120a formed on the epitaxial region 150. For example, the crystallized amorphous region 120a is a region of an amorphous layer, where the amorphous layer is formed substantially over the substrate 110 and is crystallized via a solid-phase epitaxial growth process. The solid-phase epitaxial growth process uses a crystalline semiconductor structure of a seed wafer as a crystal template in crystallizing the amorphous layer, where the seed wafer is located above the amorphous layer and has, for example, a (111) crystal orientation, and thus causes the crystallized amorphous region 120a to take on the crystal orientation, e.g., (111), of the seed wafer. The solid-phase epitaxial growth process also causes a crosslink to exist at an interface between the epitaxial region 150 and the crystallized amorphous region 120a, where some atoms of the epitaxial region 150 penetrate into the crystallized amorphous region 120a and where some atoms of the crystallized amorphous region 120a penetrate into the epitaxial region 150 through the interface between the epitaxial region 150 and the crystallized amorphous region 120a. The crystallized amorphous region 120a is, for example, a crystallized silicon, a crystallized germanium, a crystallized III-V semiconductor material, or a combination thereof.

The first crystalline semiconductor layer 120 further includes an epitaxial region 120b grown on the crystallized amorphous region 120a. For example, the epitaxial region 120b is grown on the crystallized amorphous region 120a via an epitaxial growth process, such as a gas-phase epitaxial growth process. The epitaxial growth process uses the crystallized amorphous region 120a as a seed in growing the epitaxial region 120b, and thus causes the epitaxial region 120b to take on the crystal orientation, e.g., (111), of the crystallized amorphous region 120a.

The third crystalline semiconductor layer 140 includes a crystallized amorphous region 140a and an epitaxial region 140b.

The crystallized amorphous region 140a is formed on the epitaxial region 160. For example, the crystallized amorphous region 140a is a region of an amorphous layer that is formed over the substrate 110 and that is crystallized via a solid-phase epitaxial growth process. The solid-phase epitaxial growth process uses a crystalline semiconductor structure of a seed wafer as a crystal template in crystallizing the amorphous layer, where the seed wafer is located above the amorphous layer and has, for example, a (111) crystal orientation, and thus causes the crystallized amorphous region 140a to take on the crystal orientation, e.g., (111), of the seed wafer. The solid-phase epitaxial process also causes a crosslink to exist at an interface between the epitaxial region 160 and the crystallized amorphous region 140a, where some atoms of the epitaxial region 160 penetrate into the crystallized amorphous region 140a and where some atoms of the crystallized amorphous region 140a penetrate into the epitaxial region 160 through the interface between the epitaxial region 160 and the crystallized amorphous region 140a. The crystallized amorphous region 140a is, for example, a crystallized silicon, a crystallized germanium, a crystallized III-V semiconductor material, or a combination thereof.

It is noted that the regions 150, 160, 120a, 140a are termed as "crystallized amorphous regions" for clarity, and it should be understood that the regions 150, 160, 120a, 140a are no longer amorphous after the solid-phase epitaxial growth process.

The epitaxial region 140b is grown on the crystallized amorphous region 140a. For example, the epitaxial region 140b is grown on the crystallized amorphous region 140a via an epitaxial grown process, such as a gas-phase epitaxial growth process. The epitaxial growth process uses the crystallized amorphous region 140a as a seed in growing the epitaxial region 140b, and thus causes the epitaxial region 140b to take on the crystal orientation, e.g., (111), of the crystallized amorphous region 140a.

The second crystalline semiconductor layer 130 is grown on the intermediate region of the substrate 110 and is laterally disposed of the epitaxial regions 150, 160 and the first and third crystalline semiconductor layers 120, 140. For example, the second crystalline semiconductor layer 130 is grown on the intermediate region of the substrate 110 via an epitaxial growth process, such as a gas-phase epitaxial growth process. The epitaxial growth process uses the substrate 110 as a seed in growing the second crystalline semiconductor layer 130, and thus causes the second crystalline semiconductor layer 130 to take on the crystal orientation, e.g., (100), of the substrate 110.

Although the first and third crystalline semiconductor layers 120 and 140 is exemplified as having a (111) crystal orientation and although the second crystalline semiconductor layer 130 is exemplified as having a (100) crystal orientation, it should be understood that the first and third crystalline semiconductor layers 120 and 140 may have one of (100), (110), and (111) crystal orientations, and the second crystalline semiconductor layer 130 may have another one of (100), (110), and (111) crystal orientations, so long as the crystal orientation of the first and third crystalline semiconductor layers 120 and 140 have a different orientation of the second crystalline semiconductor layer 130.

The semiconductor structure 100 further includes first and second spacers 170, 180. The first spacer 170 is disposed between the epitaxial region 150 and a lower region of the second crystalline semiconductor layer 130 and between the first crystalline semiconductor layer 120 and an upper region of the second crystalline semiconductor layer 130. The second spacer 180 is disposed between the epitaxial region 160 and the lower region of the second crystalline semiconductor layer 130 and between the third crystalline semiconductor layer 140 and the upper region of the second crystalline semiconductor layer 130. The first and second spacers 170, 180 are, for example, an oxide, a nitride, any other suitable dielectric material, or a combination thereof.

As illustrated in FIG. 1, the spacers 170, 180, the epitaxial region 120b of the first crystalline semiconductor layer 120, the second crystalline semiconductor layer 130, and the epitaxial region 140b of the third crystalline semiconductor layer 140 are flush with each other.

Figure 2A:
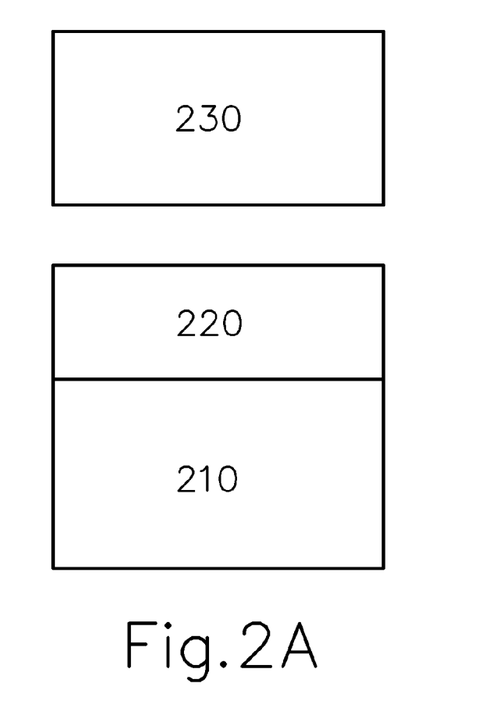
FIG. 2A depicts a beginning structure used in an example method of fabricating a semiconductor structure in accordance with some embodiments.

FIG. 2A depicts a beginning structure used in an example method of fabricating the semiconductor structure 100 in accordance with some embodiments. In the beginning structure, a substrate 210 that has, for example, a (100) crystal orientation, is provided. The substrate 210 is a bulk substrate that includes, for example, silicon, germanium, a III-V semiconductor material, or a combination thereof.

An amorphous layer 220 is formed substantially over the substrate 210 via a deposition or implantation process. The amorphous layer 220 includes a semiconductor material or a semiconductor alloy material, and is, for example, an amorphous germanium layer, an amorphous silicon layer, or another amorphous semiconductor or semiconductor alloy layer. After forming the amorphous layer 220 substantially over the substrate 210, a chemical mechanical planarization (CMP) process can be used to planarize and smoothen the amorphous layer 220, and the amorphous layer 220 is also cleaned to remove a native oxide layer on the amorphous layer 220.

FIG. 2A also depicts a seed wafer 230. In the example of FIG. 2A, the seed wafer 230 is separate from the amorphous layer 220 (e.g., the seed wafer 230 is depicted as being separate from the amorphous layer 220 prior to a bonding process that is described below with reference to FIG. 2B). The seed wafer 230 has, for example, a (111) crystal orientation. The seed wafer 230 is, for example, a silicon wafer, a germanium wafer, a sapphire wafer, or a crystalline SiGe wafer or a wafer of another crystalline material with suitable crystal lattice parameters. A CMP process can be used to planarize and smoothen the seed wafer 230, and the seed wafer 230 is also cleaned to remove a native oxide layer on the seed wafer 230. The CMP and cleaning processes that are applied to the amorphous layer 220 and the seed wafer 230 are performed to improve a quality of a bond between the amorphous layer 220 and the seed wafer 230 (e.g., to achieve an atomic contact between the layers 230, 220), as described below with reference to FIG. 2B.

Figure 2B:
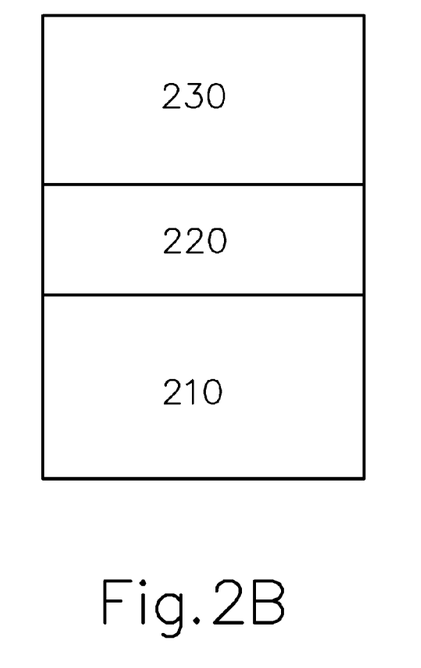
FIG. 2B depicts a bonding of a seed wafer to an amorphous layer in accordance with some embodiments.

FIG. 2B depicts a bonding of the seed wafer 230 to the amorphous layer 220 in accordance with some embodiments. In bonding the seed wafer 230 to the amorphous layer 220, the bond strength is such that atomically-intimate contact is formed between the layers 230, 220, while still allowing the seed wafer 230 to be debonded following a solid-phase epitaxial growth process (as described below with reference to FIG. 2E). The bonding process illustrated in FIG. 2B utilizes, for example, a hydrogen plasma, hydrofluoric acid (HF), hydrochloric acid (HCl), or hydrobromic acid (HBr) for passivation or activation of the bonding surfaces.

In the example of FIG. 2B, the seed wafer 230 is connected to the amorphous layer 220 via the above-described wafer-bonding process, where the wafer-bonding process is different from a deposition process or a growth process. Thus, the bonding process of FIG. 2B occurs after the formation of the amorphous layer 220 substantially over the substrate 210, where the amorphous layer 220 is deposited or grown over the substrate 210 and is not deposited or grown over the seed wafer 230. The bonding process of FIG. 2B utilizes a coarse alignment of the seed wafer 230 with the structure including the amorphous layer 220 and the substrate 210.

Figure 2C:
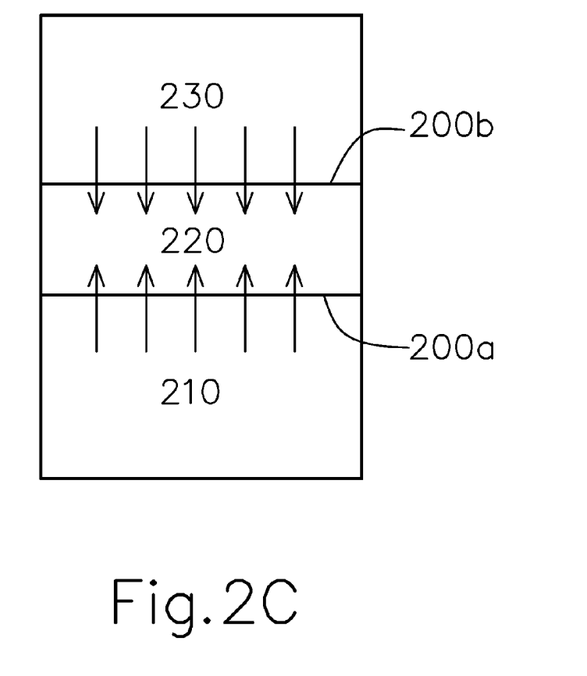
FIG. 2C depicts an annealing process used to crystallize the amorphous layer in accordance with some embodiments.

FIG. 2C depicts an annealing process used to crystallize the amorphous layer 220 in accordance with some embodiments. In FIG. 2C, following the formation of the amorphous layer 220 substantially over the substrate 210, as depicted in FIG. 2A, and the bonding of the seed wafer 230 to the amorphous layer 220, as depicted in FIG. 2B, an interface 200a exists between the substrate 210 and the amorphous layer 220, and an interface 200b also exists between the seed wafer 230 and the amorphous layer 220. The annealing process enables a solid-phase epitaxial growth process to occur in the amorphous layer 220, where the solid-phase epitaxial growth process is used to crystallize the amorphous layer 220. The solid-phase epitaxial growth process uses a crystalline semiconductor structure of the substrate 210 as a crystal template in crystallizing a lower region of the amorphous layer 220 and also uses a crystalline semiconductor structure of the seed wafer 230 as a crystal template in crystallizing an upper region of the amorphous layer 220. In certain examples, the amorphous layer 220 is doped with impurities to facilitate or accelerate the solid-phase epitaxial growth process.

As depicted in FIG. 2C, the crystallization process begins from the interface 200a between the substrate 210 and the amorphous layer 220 and thereafter proceeds upward through a certain thickness of the amorphous layer 220. Such crystallization process beginning from the substrate 210 that is located beneath the amorphous layer 220 may be termed a "bottom-up" regrowth process (e.g., in contrast to a "top-down" regrowth process that uses a seed crystal of a foreign layer located above a layer to be crystallized). The crystallization process also, at the same, begins from the interface 200b between the seed wafer 230 and the amorphous layer 220 and thereafter proceeds downward through a certain thickness of the amorphous layer 220. Such crystallization process beginning from the foreign seed wafer 230 that is located above the amorphous layer 220 may be termed a "top-down" regrowth process. In the top-down regrowth process of FIG. 2C, because the seed wafer 230 is not located at a bottom of the structure (e.g., the seed wafer 230 is a foreign wafer that is not used to provide structural support for the structure), the seed wafer 230 may be debonded from the structure (e.g., as described below with reference to FIG. 2E).

The solid-phase epitaxial growth process uses an annealing process, where the structure including the seed wafer 230, the amorphous layer 220, and the substrate 210 are annealed. Specifically, the annealing process utilizes a low temperature that does not cause damage to the structure or to structures formed in the structure. The temperature of the annealing process is lower than that used in certain conventional fabrication techniques (e.g., conventional fabrication techniques for stacking a single active layer on top of a chip that use hydrogen implant and splitting processes and use high temperature annealing that is damaging to devices or metal layers used in the devices).

In one example, the amorphous layer 220 includes an amorphous germanium layer, and the seed wafer 230 and the substrate 210 include a crystalline germanium wafer, and an annealing temperature for the solid-phase epitaxial growth is within a range of approximately 400 to 600 degrees Celsius. In another example, the amorphous layer 220 includes an amorphous silicon layer and the seed wafer 230 and the substrate 210 include a crystalline silicon wafer, and an annealing temperature for the solid-phase epitaxial growth is within a range of approximately 500 to 650 degrees Celsius. The low temperature of the annealing process facilitates debonding of the seed wafer 230 from the amorphous layer 220.

Figure 2D:
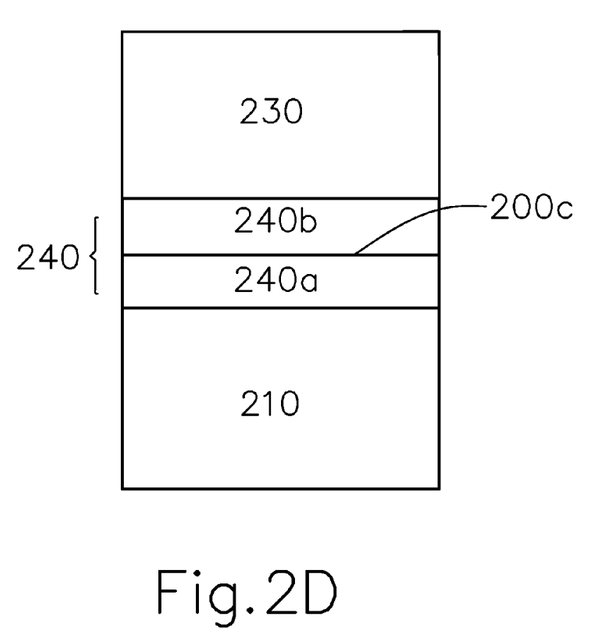
FIG. 2D depicts a crystallized amorphous layer formed as a result of a solid-phase epitaxial growth process in accordance with some embodiments.

FIG. 2D depicts a crystallized amorphous layer 240 formed as a result of the solid-phase epitaxial growth process in accordance with some embodiments. The crystallized amorphous layer 240 include a lower region 240a formed on the substrate 210, and an upper region 240b formed on the lower region 240a thereof. The example of FIG. 2D depicts a creation of a crystallized silicon layer, a crystallized germanium layer, or a crystallized semiconductor layer that comprised of various other semiconductor materials and semiconductor alloy materials. The lower and upper regions 240a, 240b of the crystallized amorphous layer 240 are of (100) and (111) crystal orientations, respectively. For example, the substrate 210 and the seed wafer 230 used for the solid-phase epitaxial growth process have (100) and (111) crystal orientations, respectively. In some embodiments, the lower and upper regions 240a, 240b of the crystallized amorphous layer 240 are of various different crystal orientations. For example, the substrate 210 used for the solid-phase epitaxial growth process may have one of (100), (110), and (111) crystal orientations, and the seed wafer 230 used for the solid-phase epitaxial growth process may have another one of (100), (110), and (111) crystal orientations. The solid-phase epitaxial growth process causes the lower and upper regions 240a, 240b of the crystallized amorphous layer 240 to take on the crystal orientation, e.g., (100), of the substrate 210 and the crystal orientation, e.g., (111), of the seed wafer 230, respectively, and thus allows the lower and upper regions 240a, 240b of the crystallized amorphous layer to have a variety of different crystal orientations. The solid-phase epitaxial growth process also causes a crosslink to exist at an interface 200c between the lower and upper regions 240a, 240b of the crystallized amorphous layer 240, where some atoms of the lower region 240a penetrate into the upper region 240b and where some atoms of the upper region 240b penetrate into the lower region 240a through the interface 200c between the lower and upper regions 240a, 240b of the crystallize amorphous layer 240.

It is noted that the layer 240 is termed as a "crystallized amorphous layer" for clarity, and it should be understood that the layer 240 is no longer amorphous after the solid-phase growth process.

In one example, a relaxed SiGe seed wafer 230 is used in the crystallization process, where the SiGe seed wafer 230 is used to crystallize either amorphous silicon or amorphous germanium. Specifically, when using the SiGe seed wafer 230, crystallizing an amorphous silicon layer or an amorphous germanium layer causes stress or strain in the resulting crystallized silicon layer or crystallized germanium layer. For example, a resulting crystallized silicon layer 240 formed using the relaxed SiGe seed wafer 230 is under tensile stress, where the tensile stress increases electron mobility in the crystallized silicon layer 240. As another example, a resulting crystallized germanium layer 240 formed using the relaxed SiGe seed wafer 230 is under compressive stress, where the compressive stress increases hole mobility in the crystallized germanium layer 240. Various other combinations of seed layer 230 materials and amorphous layer 220 materials may be selected such that the resulting crystallized semiconductor layer 240 has a level of stress or strain.

Figure 2E:
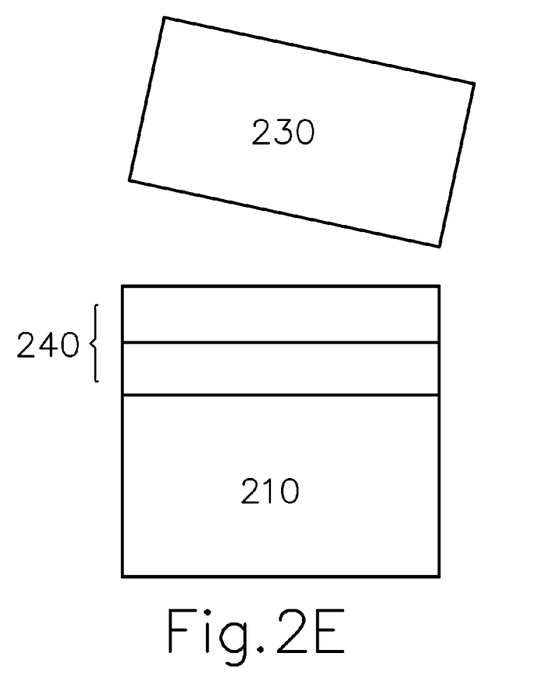
FIG. 2E depicts the seed wafer being debonded from the structure in accordance with some embodiments.

FIG. 2E depicts the seed wafer 230 being debonded from the structure in accordance with some embodiments. As described above, the bond strength between the seed layer 230 and the amorphous layer 220 is such that atomically-intimate contact is formed between the layers 230, 220, while still allowing the seed wafer 230 to be debonded following the solid-phase epitaxial growth process. Thus, as depicted in FIG. 2E, the seed wafer 230 may be debonded from the crystallized amorphous layer 240 using various conventional debonding techniques.

Measures are taken in the fabrication process to enable easier debonding of the seed wafer 230. For example, prior to the bonding of the seed wafer 230, the amorphous layer 220 is patterned (e.g., into chips) to facilitate crystallization and debonding. For example, lines are patterned into the amorphous layer 220, where the lines are areas in which the amorphous material is removed (e.g., trenches). The lines of the removed amorphous material in the amorphous layer 220 do not reach a bottom of the amorphous layer 220 (i.e., the lines do not extend to the substrate 210). Alternatively, the patterned lines are in the seed wafer 230 instead of in the amorphous layer 220. As another example of a measure that is taken in the fabrication process to facilitate debonding of the seed wafer 230, special treatment is applied at a wafer rim of the amorphous layer 220. Alternatively, the special treatment is applied to the rim of the seed wafer 230. The special treatment includes, for example, local bonding deactivation or recessing of the amorphous layer 220 (e.g., via the lines that include areas in which the amorphous material is removed, as described above). As another example, ions such as H, F, He, or Cl is introduced in the amorphous layer 220 (e.g., via an ion implantation technique) to facilitate debonding of the seed layer.

Figure 2F:
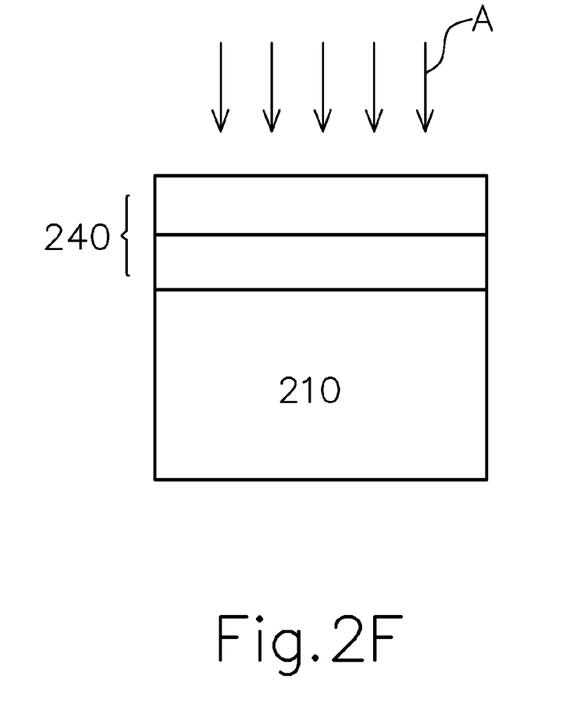
FIG. 2F depicts a chemical mechanical planarization (CMP) process being performed on the structure in accordance with some embodiments.

FIG. 2F depicts a chemical mechanical planarization (CMP) process (A) being performed on the structure in accordance with some embodiments. The CMP process (A) is performed following the debonding process of FIG. 2E, where the CMP process (A) is used to planarize, smoothen (e.g., eliminate surface roughness), and thin the crystallized amorphous layer 240 or remove impurities present on a surface of the crystallized amorphous layer 240 following the debonding process.

Figure 2G:
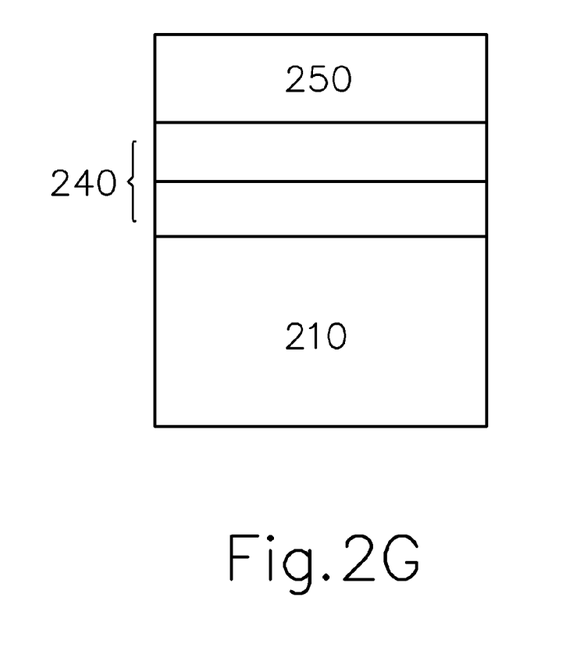
FIG. 2G depicts a formation of a hardmask layer over the crystallized amorphous layer in accordance with some embodiments.

FIG. 2G depicts a formation of a hardmask layer 250 over the crystallized amorphous layer 240 in accordance with some embodiments. The hardmask layer 250 includes, for example, an oxide, a nitride, any other dielectric material, or a combination thereof, and is formed by a low-pressure chemical vapor deposition (LPCVD) or plasma enhanced chemical vapor deposition (PECVD).

Figure 2H:
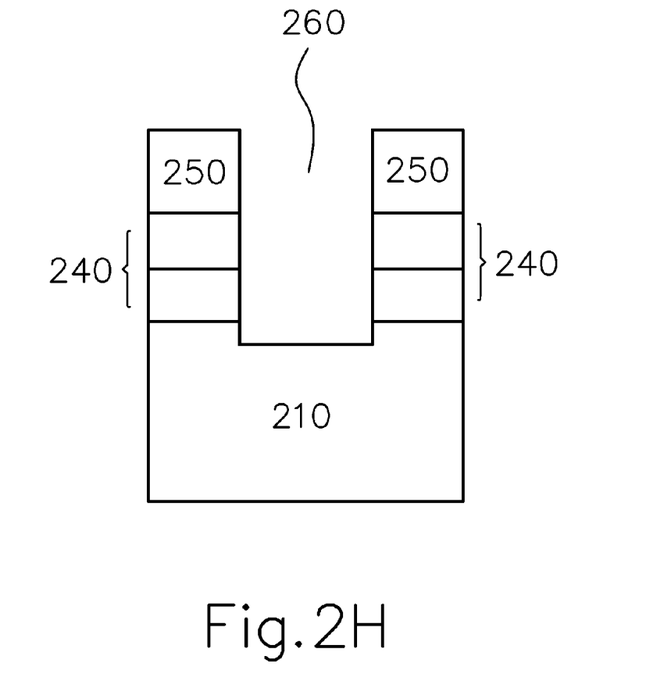
FIG. 2H depicts a formation of a recess extending through the hardmask layer and the crystallized amorphous layer and into the substrate in accordance with some embodiments.

FIG. 2H depicts a formation of a recess 260 extending through the hardmask layer 250 and the crystallized amorphous layer 240 and into the intermediate region of the substrate 210 in accordance with some embodiments. The recess 260 is formed by anisotropically etching the hardmask layer 250, the crystallized amorphous layer 240, and the substrate 210 using a patterned photoresist layer as an etching mask. As illustrated in FIG. 2H, after the formation of the recess 260, an intermediate region of the substrate 210 is exposed through the recess 260.

Figure 2I:
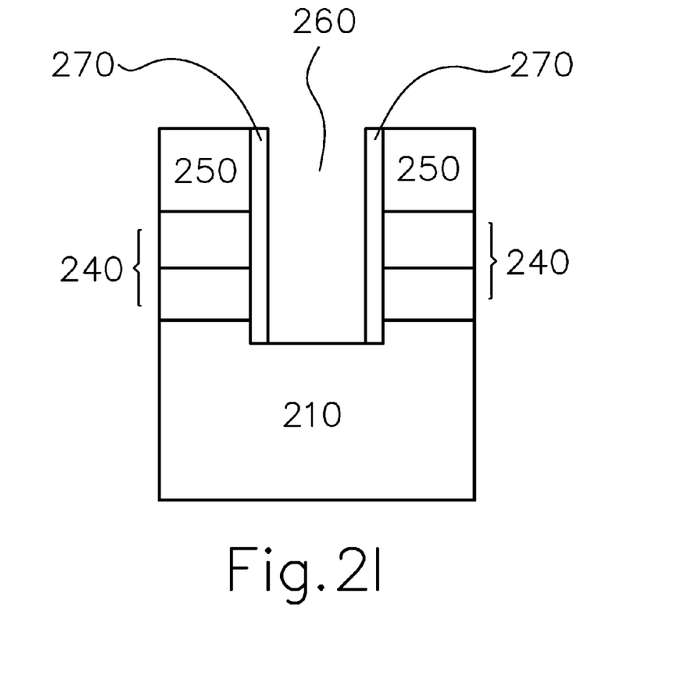
FIG. 2I depicts a formation of a spacer layer on a sidewall of the hardmask layer, a sidewall of the crystallized amorphous layer, and a sidewall of the substrate to partially fill the recess in accordance with some embodiments.

FIG. 2I depicts a formation of a spacer layer 270 on a sidewall of the hardmask layer 250, a sidewall of the crystallized amorphous layer 240, and a sidewall of the substrate 210 to partially fill the recess 260 in accordance with some embodiments. The spacer layer 270 is formed by a suitable process. For example, the spacer layer 270 is formed by blanket depositing a dielectric material over the structure of FIG. 2H, and then by anisotropically etching the dielectric material to form the spacer layer 270. The spacer layer 270 includes, for example, a silicon oxide, a silicon oxynitride, any other dielectric material, or a combination thereof.

Figure 2J:
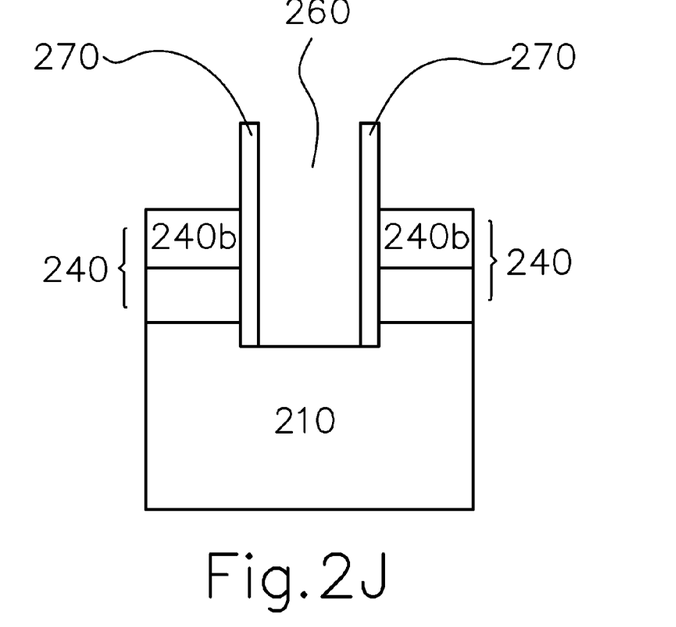
FIG. 2J depicts a structure after a removal of the hardmask layer in accordance with some embodiments.

FIG. 2J depicts a structure after a removal of the hardmask layer 250 in accordance with some embodiments. In FIG. 2J, the hardmask layer 250 is removed by an etching process (e.g., a wet etch or a dry etch), or another suitable process. As illustrated in the example of FIG. 2J, after the removal of the hardmask layer 250, the upper region 240b of the crystallized amorphous layer 240 is exposed and an upper region of the spacer layer 270 protrudes over the upper region 240b of the crystallized amorphous layer 240.

Figure 2K:
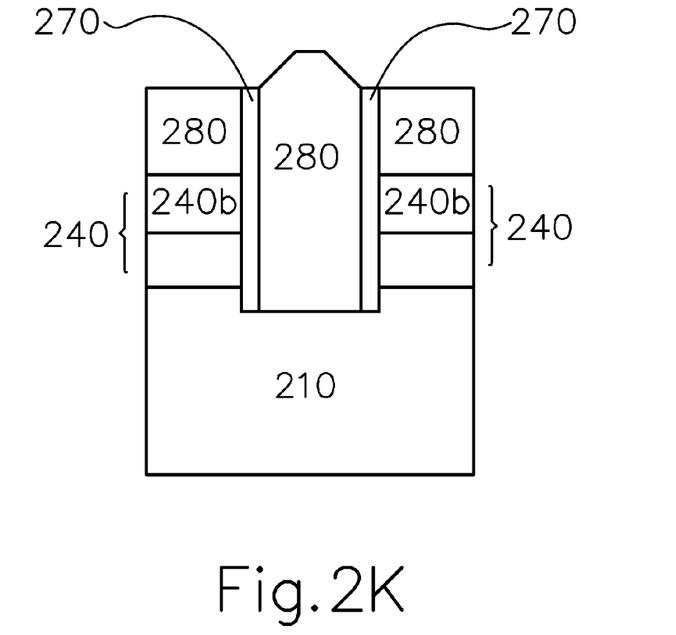
FIG. 2K depicts a formation of an epitaxial layer on the crystallized amorphous layer and in the recess in accordance with some embodiments.

FIG. 2K depicts a formation of an epitaxial layer 280 on the upper region 240b of the crystallized amorphous layer 240 and in the recess 260 in accordance with some embodiments. The epitaxial layer 280 that is formed in the recess 260 has the same material as the substrate 210, and is grown on the intermediate region of the substrate 210 via an epitaxial growth process, such as a gas-phase epitaxial growth process, using the substrate 210 as a seed. Such epitaxial growth process causes the epitaxial layer 280 that is grown on the intermediate region of the substrate 210 to take on the crystal orientation, e.g. (100), of the substrate 210. The epitaxial layer 280 that is formed on the upper region 240b of the crystallized amorphous layer 240 has the same material as the crystallized amorphous layer 240, and is grown on the upper region 240b of the crystallized amorphous layer 240 via an epitaxial growth process, such as a gas-phase epitaxial growth process, using the crystallized amorphous layer 240 as a seed. Such epitaxial growth process causes the epitaxial layer 280 that is grown on the upper region 240b of the crystallized amorphous layer 240 to take on the crystal orientation, e.g. (111), of the upper region 240b of the crystallized amorphous layer 240.

The spacer layer 270 prevents growth of the epitaxial layer 280 that is grown on the upper region 240b of the crystallized amorphous layer 240 on the epitaxial layer 280 that is grown on the intermediate region of substrate 210. Thus, as illustrated in FIG. 2K, the epitaxial layer 280 that is grown on the intermediate region of the substrate 210 is laterally disposed of the crystallized amorphous layer 240 and the epitaxial layer 280 that is grown on the upper region 240b of the crystallized amorphous layer 240.

Although the epitaxial layer 280 that is grown on the intermediate region of the substrate 210 and the epitaxial layer 280 that is grown on the upper region 240b of the crystallized amorphous layer 240 are grown simultaneously, it should be understood that the epitaxial layer 280 that is grown on the intermediate region of the substrate 210 and the epitaxial layer 280 that is grown on the upper region 240b of the crystallized amorphous layer 240 may be grown separately. That is, the epitaxial layer 280 that is grown on the intermediate region of the substrate 240 is grown first, and the epitaxial layer 280 that is grown on the upper region 240b of the crystallized amorphous layer 240 is grown second, or the epitaxial layer 280 that is grown on the upper region 240b of the crystallized amorphous layer 240 is grown first, and the epitaxial layer 280 that is grown on the intermediate region of the substrate 210 is grown second.

Figure 2L:
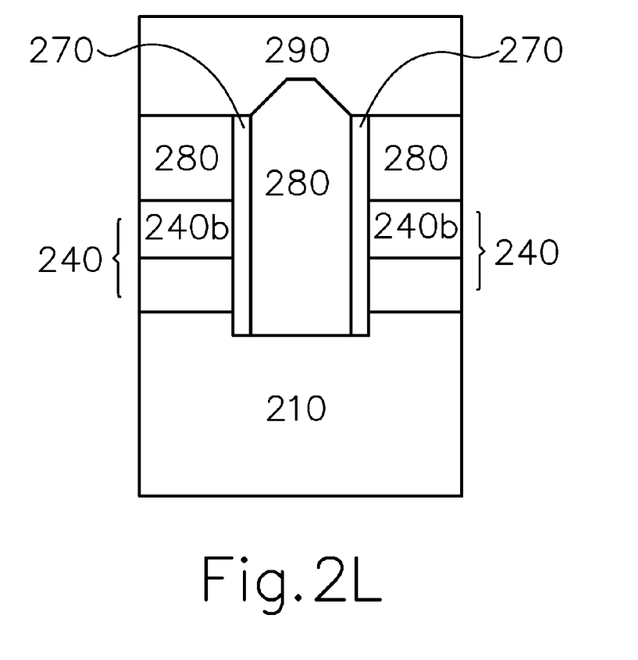
FIG. 2L depicts a formation of a dielectric layer on the structure in accordance with some embodiments.

FIG. 2L depicts a formation of a dielectric layer 290 on the structure in accordance with some embodiments. In FIG. 2L, the dielectric layer 290 is formed (e.g., via a deposition process) substantially over the spacer layer 270 and the epitaxial layer 280. The dielectric layer 290 is, for example, an oxide, a nitride, any other suitable dielectric material, or a combination thereof. After the formation of the dielectric layer 290, a CMP process is performed to remove the dielectric material, thin the epitaxial layer 280 to a desired thickness, and flush the epitaxial layer 280 and the spacer layer 270. The resulting structure includes the semiconductor structure 100 as shown in FIG. 1. It is noted that the formation of the dielectric layer 290 is optional. That is, the CMP process can be directly performed to thin the epitaxial layer 280 to a desired thickness and flush the epitaxial layer 280 and the spacer layer 270 after the formation of the spacer layer 270 as described above with reference to FIG. 2I, the removal of the hardmask layer 250 as described above with reference to FIG. 2J, and the formation of the epitaxial layer 280 as described above with reference to FIG. 2K.

Figure 3:
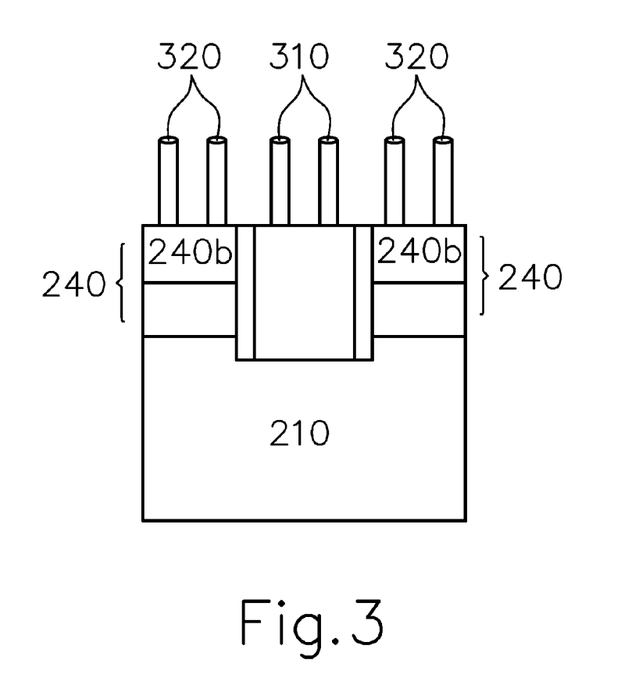
FIG. 3 depicts an example patterning of the epitaxial layer of a semiconductor structure to form nanowires in accordance with some embodiments.

FIG. 3 depicts an example patterning of the epitaxial layer of the semiconductor structure 100 to form nanowires 310, 320 in accordance with some embodiments. In FIG. 3, the nanowires 310, 320 are used in forming FETs, e.g., junction and junctionless FETs. As described above, the electrons have a high mobility along, e.g., a (100) direction, whereas the holes have a high mobility along, e.g., a (111) direction different from the direction along which the electrons have the high mobility. Thus, in the example of FIG. 3, the epitaxial layer that is grown on the intermediate region of the substrate 210, which has, e.g., a (100) crystal orientation, is patterned to form N-type conductivity nanowires 310, and the epitaxial layer that is grown on the upper region 240b of crystal amorphous layer 240, which has, e.g., a (111) crystal orientation, is patterned to form P-type conductivity nanowires 320. As such, an optimum mobility performance can be obtained for N-channel FETs that may be formed using the nanowires 310 and P-channel FETs that may be formed using the nanowires 320.

Figure 4:
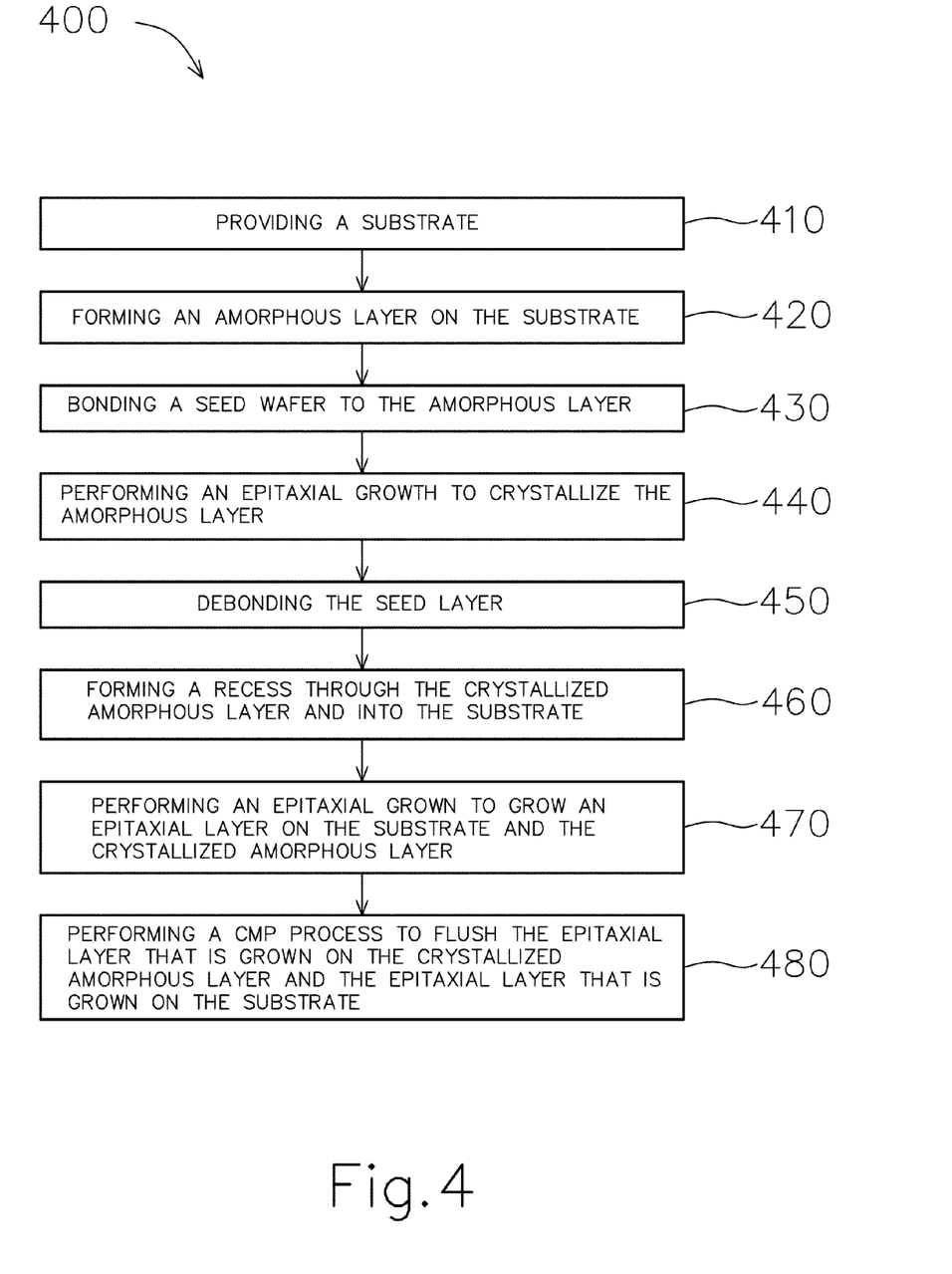
FIG. 4 is a flowchart illustrating an example method of fabricating a semiconductor structure in accordance with some embodiments.

FIG. 4 is a flowchart 400 illustrating an example method of fabricating a semiconductor structure in accordance with some embodiments. At 410, a substrate is provided. The substrate has a crystal orientation, e.g., (100). At 420, an amorphous layer is formed substantially over the substrate. At 430, a seed wafer is bonded to the amorphous layer. The seed wafer has a crystal orientation, e.g., (111), different from the crystal orientation of the substrate. At 440, a first epitaxial growth process is performed to crystallize the amorphous layer. The first epitaxial growth process uses a crystalline semiconductor structure of the seed wafer as a crystal template in crystallizing the amorphous layer and thus causes the crystallized amorphous layer to take on the crystal orientation, e.g., (111), of the seed wafer. At 450, the seed wafer is debonded from the structure. At 460, a recess is formed in the crystallized amorphous layer and into the substrate, whereby the substrate is exposed. At 470, a second epitaxial growth process is performed to grow an epitaxial layer on the substrate and the crystallized amorphous layer. The second epitaxial growth process uses the substrate as a seed to grow the epitaxial layer that is grown on the substrate and thus causes the epitaxial layer that is grown on the substrate to take on the crystal orientation, e.g., (100), of the substrate. The second epitaxial growth process uses the crystallized amorphous layer as a seed to grow the epitaxial layer that is grown on the crystallized amorphous layer and thus causes the epitaxial layer that is grown on the crystallized amorphous layer to take on the crystal orientation, e.g., (111), of the crystallized amorphous layer. At 480, a CMP process is performed to flush the epitaxial layer that is grown on the substrate and the epitaxial layer that is grown on the crystallized amorphous layer.

It has thus been shown that the semiconductor structure 100 of the present disclosure includes a substrate 110, and first, second, and third crystalline semiconductor layers 120, 130, 140. The first and third crystalline semiconductor layers 120, 140 are formed on the substrate 210 and have a crystal orientation, e.g., (111). The second crystalline semiconductor layer 130 is formed on the substrate 110 between the first and third crystalline semiconductor layers 120, 140, is laterally disposed of the first and third crystalline semiconductor layers 120, 140, and has a crystal orientation, e.g., (100), different from the crystal orientation, e.g., (111), of the first and third crystalline semiconductor layers 120, 140. The construction as such permits a formation of P-channel FETs in the first and third crystalline semiconductor layers 120, 140 of the semiconductor structure 100, and a formation of N-channel FETs in the second crystalline semiconductor layer 130 of the semiconductor structure 100. As such, an optimum mobility performance can be obtained for both the N-channel FETs and the P-channel FETs that may be formed in the semiconductor structure 100 of the present disclosure.

In an embodiment of a semiconductor structure, the semiconductor structure comprises a substrate and first and second crystalline semiconductor layers. The first crystalline semiconductor layer has a first crystal orientation, and includes a crystallized amorphous region formed on the substrate. The second crystalline semiconductor layer is formed on the substrate, is laterally disposed of the first crystalline semiconductor layer, and has a second crystal orientation different from the first crystal orientation.

In another embodiment of a semiconductor structure, the semiconductor structure comprises a substrate, an epitaxial layer, and first and second crystalline semiconductor layers.

The substrate has a crystal orientation. The epitaxial layer is grown on the substrate. The first crystalline semiconductor layer has a crystal orientation different from the crystal orientation of the substrate and is crosslinked with the epitaxial layer at an interface between the epitaxial layer and the first crystalline semiconductor layer. The second crystalline semiconductor layer is grown on the substrate and is laterally disposed of the first crystalline semiconductor layer.

In an embodiment of a method of fabricating a semiconductor structure, a substrate is provided. A crystallized amorphous layer is formed on the substrate. The crystallized amorphous layer has a first crystal orientation. A crystalline semiconductor layer is formed on the substrate. The crystalline semiconductor layer is laterally disposed of the crystallized amorphous layer and has a second crystal orientation different from the first crystal orientation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a substrate;
   a first crystalline semiconductor layer having a first crystal orientation, and including a crystallized amorphous region formed on the substrate and an epitaxial region grown on the crystallized amorphous region; and
   a second crystalline semiconductor layer formed on the substrate, laterally disposed of the first crystalline semiconductor layer, and having a second crystal orientation different from the first crystal orientation.

2. The semiconductor structure of claim 1, wherein the second crystalline semiconductor layer is grown on the substrate.

3. The semiconductor structure of claim 1, wherein the first and second crystalline semiconductor layers are flush with each other.

4. The semiconductor structure of claim 1, further comprising a spacer disposed between the first and second crystalline semiconductor layers.

5. The semiconductor structure claim 1, wherein the substrate is a bulk substrate.

6. A semiconductor structure comprising:
   a substrate;
   a first crystalline semiconductor layer having a first crystal orientation and including a crystallized amorphous region formed on the substrate; and
   a second crystalline semiconductor layer formed on the substrate, laterally disposed of the first crystalline semiconductor layer, and having a second crystal orientation different from the first crystal orientation, wherein the first crystal orientation is (111) and the second crystal orientation is (100).

7. A semiconductor structure comprising:
   a substrate having a crystal orientation;
   an epitaxial layer grown on the substrate;
   a first crystalline semiconductor layer having a crystal orientation different from the crystal orientation of the substrate and crosslinked with the epitaxial layer at an interface between the epitaxial layer and the first crystalline semiconductor layer; and
   a second crystalline semiconductor layer grown on the substrate and laterally disposed of the first crystalline semiconductor layer.

8. The semiconductor structure of claim 7, wherein the epitaxial layer is a crystallized amorphous layer.

9. The semiconductor structure of claim 7, wherein the first and second crystalline semiconductor layers are flush with each other.

10. The semiconductor structure of claim 7, further comprising a spacer disposed between the first and second crystalline semiconductor layers.

11. The semiconductor structure of claim 7, wherein the substrate is a bulk substrate.

12. The semiconductor structure of claim 7, wherein the crystal orientation of the substrate is (100) and the crystal orientation of the first crystalline semiconductor layer is (111).

13. A method of fabricating a semiconductor structure, the method comprising:
   providing a substrate;
   forming on the substrate a crystallized amorphous layer that has a first crystal orientation, wherein the forming on the substrate a crystallized amorphous layer includes forming an amorphous layer over the substrate, bonding a seed wafer to the amorphous layer, and performing a first epitaxial growth process to crystallize the amorphous layer, the first epitaxial process using a crystalline semiconductor structure of the seed wafer as a crystal template; and
   forming on the substrate a crystalline semiconductor layer that is laterally disposed of the crystallized amorphous layer and that has a second crystal orientation different from the first crystal orientation.

14. The method of claim 13, wherein the forming a crystalline semiconductor layer on the substrate includes:
   forming a recess through the crystallized amorphous layer and into the substrate; and
   performing a second epitaxial growth process to grow an epitaxial layer on the substrate in the recess.

15. The method of claim 13, further comprising performing a second epitaxial growth process to grow an epitaxial layer on the crystallized amorphous layer.

16. The method of claim 13, wherein the substrate is a bulk substrate.

17. The method of claim 15, further comprising performing a planarizing process to flush the crystalline semiconductor layer and the epitaxial layer that is grown on the crystallized amorphous layer.

18. A method of fabricating a semiconductor structure, the method comprising:
   providing a substrate;
   forming on the substrate a crystallized amorphous layer that has a first crystal orientation; and
   forming on the substrate a crystalline semiconductor layer that is laterally disposed of the crystallized amorphous layer and that has a second crystal orientation different from the first crystal orientation, wherein the first crystal orientation is (111) and the second crystal orientation is (100).

* * * * *